United States Patent [19]

Kaufman et al.

[11] Patent Number: 4,721,912

[45] Date of Patent: Jan. 26, 1988

[54] APPARATUS AND METHOD FOR INITIALLY CAPTURING MOST SIGNIFICANT LOW SPATIAL FREQUENCY NMR IMAGING DATA

[75] Inventors: Leon Kaufman, San Francisco; Lawrence E. Crooks, Richmond; Douglas A. Ortendahl, Berkeley, all of Calif.

[73] Assignee: The Regents of the University of California, Berkeley, Calif.

[21] Appl. No.: 781,735

[22] Filed: Sep. 30, 1985

[51] Int. Cl.$^4$ ............................................. G01R 33/20
[52] U.S. Cl. ..................................... 324/309; 324/307
[58] Field of Search ............... 324/309, 307, 311, 312, 324/313; 128/653; 364/414

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,471,305 | 9/1984 | Crooks et al. | 324/309 |
| 4,516,074 | 5/1985 | Sugimoto | 324/309 |
| 4,549,140 | 10/1985 | MacFall | 324/309 |
| 4,581,581 | 4/1986 | Pelc | 324/309 |
| 4,614,195 | 9/1986 | Bottomley et al. | 324/309 |
| 4,663,591 | 5/1987 | Pelc et al. | 324/309 |
| 4,684,891 | 8/1987 | Feinberg | 324/309 |

OTHER PUBLICATIONS

Kaufman et al., NMR Imaging In Medicine, Igaku-Shoin NY, NY, 1981, Chapters 2, 3 and 4.
Book of Abstracts, Society of Magnetic Resonance in Medicine, 4th Ann. Meeting, Aug. 19-23, 1985, vol. 2, Categories 11-18, pp. 939, 948-949, 962-963, 977, 1062-1065.

Primary Examiner—Stewart J. Levy
Assistant Examiner—Scott M. Oldham
Attorney, Agent, or Firm—Nixon & Vanderhye

[57] ABSTRACT

NMR imaging apparatus and method is arranged so as elicit NMR image response data in a predetermined order which provides the more significant lower spatial frequency image data during an initial portion of a relatively long complete image data acquisition cycle. The remaining higher spatial frequency image data is captured during subsequent portions of the overall image data acquisition cycle. In this manner, apparent motion artifact in the resulting image is reduced. Furthermore, such a special data acquisition sequence permits image reconstruction processes to produce a recognizable image at an earlier time in the complete data gathering cycle thus permitting a more timely image display for the apparatus operator to use in monitoring and/or controlling the NMR imaging procedure.

2 Claims, 15 Drawing Figures

NMR PROJECTION
IMAGE RECONSTRUCTION)

LOW SPATIAL
FREQUENCY INITIAL
CAPTURING SEQUENCE

NMR FOURIER TRANSFORM IMAGE
RECONSTRUCTION DATA ACQUISITION CYCLE

FOURIER TRANSFORM RECONSTRUCTION

APPARATUS AND METHOD FOR INITIALLY CAPTURING MOST SIGNIFICANT LOW SPATIAL FREQUENCY NMR IMAGING DATA

FIELD OF THE INVENTION

This invention relates to apparatus and method for NMR (nuclear magnetic resonance) imaging wherein data representing the internal distribution of selected molecular structures within an object under test is obtained using nuclear magnetic resonance phenomena.

BACKGROUND OF THE INVENTION

This application is related to the following commonly assigned patents and patent applications.

U.S. Pat. No. 4,297,637—Crooks et al (1981)
U.S. Pat. No. 4,318,043—Crooks et al (1982)
U.S. Pat. No. 4,471,305—Crooks et al (1984).
U.S. Pat. No. 4,599,565—Hoenninger et al (this and above previous cases form a continuous connected chain of continuation-in-part applications dating from the July 20, 1978 filing date of U.S. Pat. No. 4,297,637)
U.S. application Ser. No. 515,116, filed July 19, 1983 for Crooks
U.S. application Ser. No. 515,957, filed July 21, 1983 for Crooks et al
U.S. application Ser. No. 515,857, filed July 21, 1983 for Cannon et al The entire disclosure contained in each of the above-identified related patents and patent applications is hereby expressly incorporated by reference.

As explained in the above-referenced related patents/applications, radio frequency spin echo NMR responses can be elicited from selected internal regions of an object under test by transmitting an initial NMR r.f. perturbation pulse into the object followed by at least one subsequent 180° NMR r.f. nutation pulse (sometimes called a "flipping" pulse). Selected (typically planar) regions of the object under test are selectively activated at the appropriate NMR Lamor radio frequency by employing magnetic gradients oriented along x, y or z axes (or any other desired axis) and superimposed upon a static magnetic field during the transmitted r.f. perturbation and flipping pulses. Additional magnetic gradients are typically employed to correct for undesirable de-phasing effects during measurement cycles and/or to purposefully phase encode some NMR responses.

A spin echo NMR response occurs in accordance with the "rule of equal times" after each 180° flipping pulse. Synchronous r.f. modulation/demodulation techniques are preferably employed and a rapid succession of individual NMR measurement cycles are typically repeated at the same or different repetition rates (e.g., 0.5 second and 1.0 second per cycle) during an overall or complete NMR image data acquisition cycle (e.g., typically in excess of 1 minute) from which sufficient NMR spin echo response data is collected so as to permit the generation of an NMR image of the selected internal region of an object under test. The NMR image data may be stored, displayed or otherwise used as desired and as will be appreciated. Typically such processing involves the combination of synchronously detected spin echo signals from plural individual NMR measurement cycles and the use of Fourier transformation(s) or other image reconstruction processes using the combined spin echo data thus acquired. The above-referenced related patents/applications teach several techniques for deriving NMR images and/or image data from NMR r.f. spin echo signals and such details will therefore not be repeated in the present application.

The principles and techniques of NMR imaging are also discussed in detail at Chapters 2, 3 and 4 of "NMR Imaging In Medicine" edited by L. Kaufman, L. Crooks and A. R. Margulis (Igaku-Shoin, New York, New York). Two of the possible NMR imaging techniques discussed in Chapter 3 use projection reconstruction (PR) and two-dimensional Fourier transform (FT) techniques.

To effect projection reconstruction, a linear magnetic gradient is established (e.g. during NMR excitation/response times) along an axis that is sequentially rotated by an increment angle so as to collect NMR image data representing projection views from correspondingly sequentially incremented angles which may then be filtered (e.g. with a digital convolution algorithm) and back-projected or otherwise processed into the picture elements (pixels) of an image plane using techniques similar to those used in computed x-ray tomography. There are many such known projection reconstruction algorithms. Such prior art back-projection image reconstruction algorithms are generally depicted at FIGS. 2 and 3A. As there shown, it is customary to obtain approximately N equally spaced projection views over a total 180° angular interval with the raw data being successively gathered over monotonically increasing angles relative to some initial view angle.

Fourier transforms (or other similar transformation algorithms) may also be used to construct visual images from NMR responses. For example, as depicted at FIGS. 5 and 6A, a magnetic gradient (i.e. $G_Y$ along a Y axis) may have a controlled duration and amplitude so as to effect a desired increment of phase encoding during the NMR measurement sequence. As depicted in FIG. 3, the measurement sequence may involve a 90° NMR excitation pulse followed by a 180° NMR excitation pulse so as to produce (in accordance with the rule of equal times), an NMR spin echo SE response signal. Although a Y axis phase encoding magnetic gradient is schematically depicted in FIG. 5, it should be appreciated that other axes could also be utilized and that the phase encoding gradient could be applied at different portions of a given measurement sequence. Such phase encoding gradient is changed during successive NMR data measurement sequences so as to obtain a family of NMR image data responses which, when properly Fourier transformed, give rise to pixel values for an NMR image for the planar or other volume of nuclei from which NMR responses have been elicited. As shown in FIG. 5, the first measurement sequence typically has heretofore utilized a maximum phase encoding in one direction followed by successively less phase encoding in the following measurement sequences until a zero phase encoding measurement sequence occurs. Thereafter, successively increasing degrees of phase encoding in the opposite sense are utilized for a still further plurality of measurement sequences so as to give rise to the complete image data acquisition cycle comprising a family of NMR responses which can be subjected to Fourier transformation in accordance with known procedures to produce an NMR image.

In both PR and FT imaging techniques, the prior data acquisition sequences have involved successive procedures which only change by a small incremental amount (related to the desired resulting image resolution). In fact, in some computed tomography techniques, some overlapped scanning may be performed with averaging techniques utilized in an attempt to ensure that only a relatively continuous set of raw data is input to the imaging algorithm. If the object under test moves between the start and finish times of a complete image data gathering procedure, the resulting image will include motion artifacts resulting from an attempt to reconstruct a somewhat inconsistent noncontinuous set of input data.

In conventional computed x-ray tomography, such motion artifact may be minimized by patient breath-holding during a fairly rapid scan (e.g. 1–20 seconds) during which all of the x-ray image data is taken. However, such rapid collection of all NMR imaging data, at least in the near future, cannot be obtained in such a short time interval that a patient might be expected to continuously hold his/her breath (e.g. on the order of one minute or more is currently required for a complete NMR imaging procedure). Nevertheless, a patient might still be expected to hold his/her breath (or to otherwise remain substantially motionless) for the first 20 seconds or so of a longer NMR imaging data gathering routine.

SUMMARY OF THE INVENTION

We have now discovered an NMR imaging technique whereby the more significant lower spatial frequency NMR image data may be obtained during these early stages of a longer NMR imaging procedure. By so doing, if motion can be avoided during the early stages when such low spatial frequency image data is being gathered, then the overall degree of motion artifact apparent in the complete reconstructed NMR image may be reduced. Furthermore, a recognizable NMR image may be obtained at an earlier stage in a complete data gathering cycle thus permitting an approximately "real time" image display to the operator for better monitoring and/or control of the overall procedure.

With respect to projection reconstruction algorithms, we have recognized that the projection views furthest apart from one another are capable of generating more significant overall image information than are a similar number of more closely spaced projections taken over a smaller total angle. Of course projection views taken at progressively finer angular steps are important in providing increasing image detail (e.g. at higher and higher spatial frequencies). However, so as to initially collect the more significant lower spatial frequency data, the projection views should be taken at angles which are initially spaced quite far from one another and then progressively closer to one another. The exemplary embodiment takes projection views over a total 180° angular segment with successive projections being taken at angles which successively bisect the included angle between previous projection views. For example, one such sequence of angular projections might start with a projection at 0° followed by projections at relative angles of 90°, 135°, 45°, 157°, 111°, 22°, etc. -rather than the more traditional 0°, 1°, 2°, 3°, ... 180° projection angles).

With traditional x-ray computed tomography, such "jumping around" during the data acqisition procedure is often impractical because, in today's commercial scanners, a rather massive apparatus (including an x-ray tube) typically is physically rotated to positions corresponding to each projection angle before the data can be taken. Accordingly, such non-contiguous data gathering procedures would add considerable complexity and time to the overall procedure.

However, in NMR imaging apparatus and method, the projection angle is determined merely by the waveforms of electrical currents applied to magnetic gradient coils. Accordingly, the data-taking order for projection angles can be arbitrarily shifted from one data measurement subsequence to the next so as to capture the more significant lower spatial frequency image data at earlier times in the overall data gathering procedure.

Similarly, a special data acquisition sequence can be used in NMR Fourier transform imaging techniques so as to initially capture the lower spatial frequency image data. In particular, a rearranged data acquisition sequence can be used wherein the first measuring sequence employs zero phase encoding followed by successive pairs of measurement sub-sequences wherein ever greater alternating positive and negative phase-encoding is employed. For example, after a zero phase encoding sequence, a pair of sequences using the smallest increments of positive and negative phase encoding may be effected, followed by a pair of sequences wherein twice as much positive and negative encoding are employed and so on until a final pair of data acquisition sequences is used wherein the maximum positive and negative phase encoding is employed. Again, since the degree of phase encoding is purely a function of the electrical waveform sequence applied to static magnetic gradient coils, arbitrary ordering can be conveniently effected by merely changing the programmed control of the apparatus which generates the magnetic gradient pulse currents. The same general type of reordered data acquisition sequences can be used for three-dimensional projection reconstruction and Fourier transform NMR imaging as should be apparent to those in the art.

Once the NMR image data is in the process of being accumulated in this new sequence which provides the most significant low spatial frequency image data at an earlier time, then it is also possible to begin the image reconstruction process at an earlier time (i.e. a recognizable image will be produced at an earlier time in such reconstruction processes) after only a few basic measurement sub-sequences have been effected. The initial images thus produced after only some of the earlier data has become available, can then be updated as ever more projections (adding ever finer degrees of higher spatial frequency detail) are obtained thus increasing the visible detail to an operator or the like.

Such a reordering of the data acquisition sequences thus permits reasonable images to be reconstructed and presented to an NMR imaging operator even while the overall data acquisition for the final image is continuing thus generating an approximately "live" display for use by the operator in monitoring/controlling the procedure in a more timely manner. For example, if there is some severe anomaly in the data-taking procedure (e.g. severe motion artifact) that becomes apparent during an early stage in the data gathering procedure, then the operator would be thus enabled to detect this fact and to abort such procedure and begin again thus minimizing the wasted utilization of an expensive NMR imaging facility.

BRIEF DESCRIPTION OF THE DRAWINGS

These as well as other objects and advantages of this invention will be better understood by carefully reading the following detailed description of the presently preferred exemplary embodiments of this invention in conjunction with the accompanying drawings, of which.

DETAILED DESCRIPTION OF PREFERRED EXEMPLARY EMBODIMENTS

Figure 1:
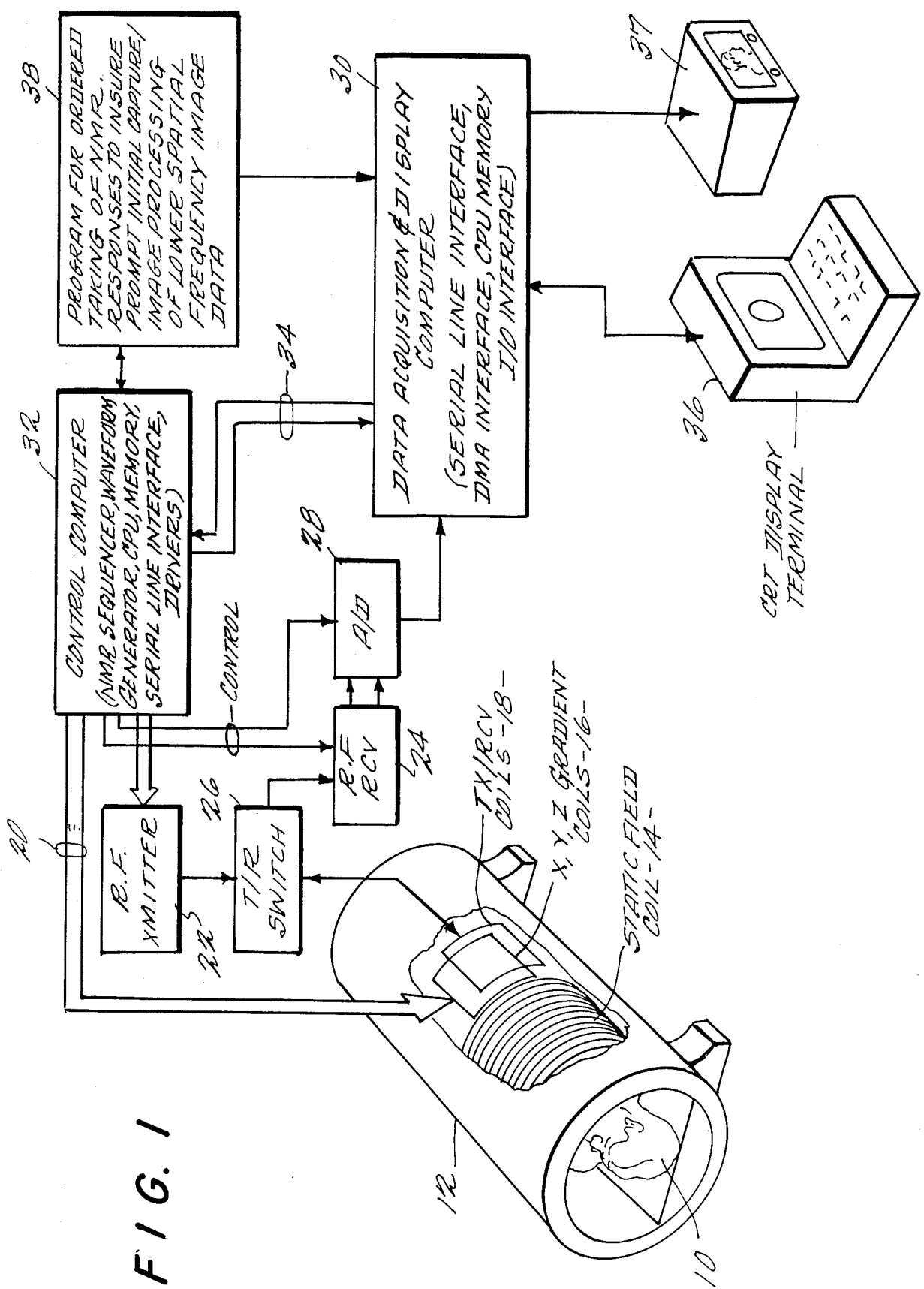
FIG. 1 is an overall schematic block diagram view of an imaging NMR scanner in which an exemplary embodiment of this invention is incorporated.

The details of a complete imaging NMR scanner as depicted in FIG. 1 are supplied more completely in the above-referenced related patents/applications. In brief overview, the patient or other object under examination 10 is placed within a large cryogenic electromagnetic assembly 12 which includes a static magnetic field coil 14 and, typically, x, y and z magnetic gradient coils 16. Radio frequency transmit/receive coils 18 are also included in the assembly to permit NMR excitation r.f. signals to be transmitted into the object under test 10 and NMR response r.f. signals to be received therefrom. The x, y, z gradient coils 16 are typically driven over lines 20 with pulsed drive currents having selected amplitude, duration and timing within a given measurement cycle so as to cause only selected regions of the object under test 10 to be responsive to transmitted NMR signals and/or to provide various corrections (e.g., "phasing" corrections) and/or to encode an NMR spin echo response as it is being read out during a given NMR measurement cycle.

Receiver 24 and transmitter 22 are given controlled sequential access to the common r.f. coils 18 via a transmit/receive switch 26 (which might comprise a "magic T" or non-reciprocal r.f. "circulator" as will be appreciated). Typically, the output of the r.f. receiver is digitized in an analog-to-digital converter 28 before or as it is being input to the data acquisition and display computer 30. The overall sequence of NMR excitation transmissions and magnetic gradient coil drivers, etc., may typically be carried out in a separate control computer system 32 which communicates, for example, over a serial line interface 34 with the data acquisition and display computer 30. A CRT display/keyboard terminal 36 is employed for overall control of the imaging NMR scanner and monitor 37 or actual display of images derived thereby.

The imaging NMR scanner of FIG. 1 is further modified (typically by suitable modification of the controlling programs utilized in the data acquisition and display computer 30 and/or in the control computer 32 as depicted in block 38) so as to be capable of selectively ordered taking of NMR responses to insure prompt initial capture (and, if desired, image processing) of lower spatial frequency image data prior to relatively higher spatial frequencies. In this manner, later occurring movement artifacts may be minimized and/or more rapid meaningful image displays may be obtained. Typically, the modified program represented by block 38 would be embodied in a modified physical structure of digital memory devices such as RAM, ROM, magnetic disks, etc., so as to implement the modified NMR test data acquisition/processing sequences to be further described with respect to subsequent flow charts in FIGS. 4 and/or 7.

Those familiar with the earlier referenced and related patents/applications will understand that NMR image data may result from a 1, 2 or 3 dimensional Fourier transformation of collected NMR spin echo signals elicited during successive individual measurement cycles. Typically, a measurement cycle includes an initial perturbing NMR nutation pulse (e.g., 90°) followed by one or more 180° r.f. NMR pulses which, in accordance with the "rule of equal times" elicits one or more corresponding NMR spin echo signals. Such spin echo signals may then be coherently detected, sampled, digitized and stored prior to subsequent digital processing steps. Where coherent or synchronous modulation/demodulation processes are employed, spin echo NMR signal responses from sets of plural measurement cycles may be algebraically combined prior to such Fourier transformation.

As will be appreciated, where the spin echo signal has emanated from a line volume and is phase-encoded therealong due to an imposed magnetic gradient during readout of the spin echo signal, a one-dimensional Fourier transformation provides corresponding signal intensity values (e.g., the values of the Fourier coefficients for a sequence of different sinusoidal frequency components) for NMR spin echo responses at different component signal frequencies corresponding to different elemental volume or voxel locations along that line.

On the other hand, if the NMR spin echo signals have been elicited from a planar volume, then a two-dimensional Fourier transformation process may be required to resolve the raw data from the entire plane into data representative of individual incremental voxels within that plane. Alternatively, where the spin echo signals come from a planar region of interest, a series of one-dimensional Fourier transforms may give rise to data representing one-dimensional projections through that planar volume at different radial angles (assuming that corresponding different radially-directed magnetic gradients were utilized during the spin echo readouts) followed by conventional reconstruction signal processing using, for example, the well known filtered back projection or convolution/back projection reconstruction processes for reconstructing a multi-dimensional function from a large number of its one-dimensional projections (already well known in the art of X-ray computed tomography and electron microscopy).

The earlier referenced related patents/applications already fully describe exemplary apparatus/method required for generating NMR excitation signals (e.g., an initial 90° perturbation pulse and one or more subsequent 180° nutation pulses having controlled relative phases) as well as the necessary magnetic gradients which are employed for selectively choosing selected portions of the object under test for NMR excitation/response. Similarly, the needed apparatus/method for initially capturing spin echo signals and for processing such signals (e.g., by Fast Fourier Transform) to produce NMR image data is also known from the earlier referenced related patents/applications. Accordingly, such details need not be here repeated.

Figure 2:
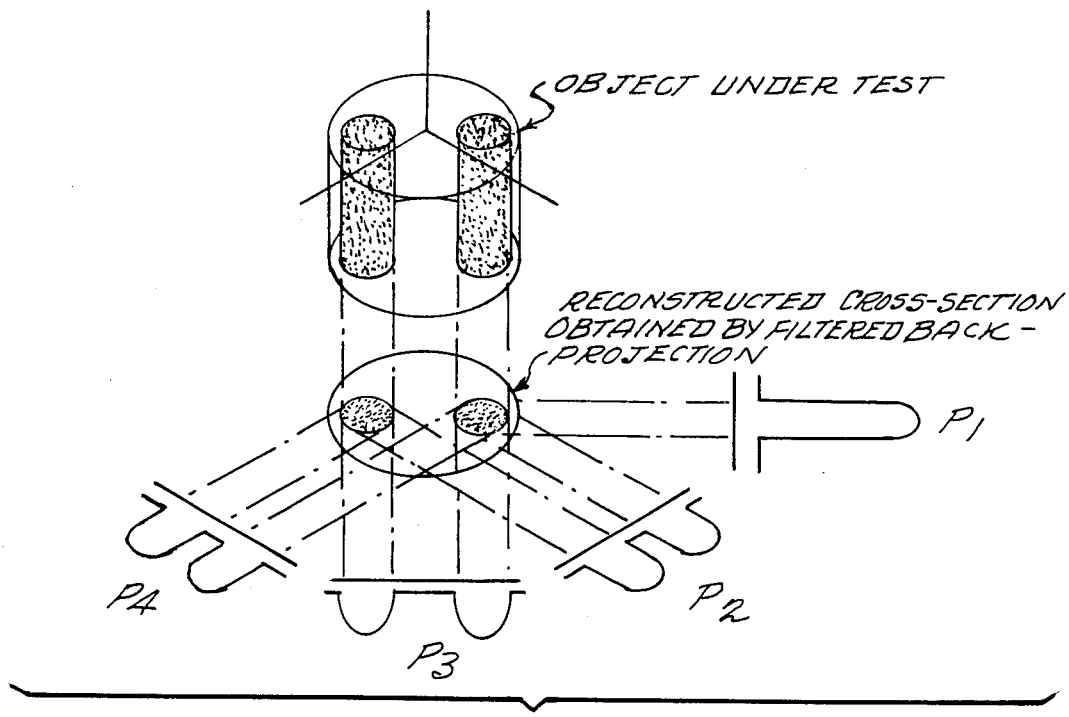
FIG. 2 is a graphical depiction of a prior art NMR image projection reconstruction (PR) technique.
Figure 3A:
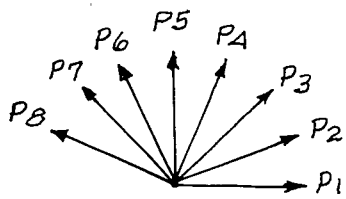
FIGS. 3A and 3B are comparative schematic depictions of a prior art PR data acquisition sequence (3A) with a first exemplary embodiment of a data acquisition sequence in accordance with this invention (3B)

As depicted in FIG. 2, successive projections views P1, P2, P3, etc. may be "back projected" in accordance with known techniques so as to provide a reconstructed "image" of a cross section through an object under test. As also depicted in FIG. 3A, it is conventional practice to succesively take such projections at monotonically increasing angles relative to an initial view angle. FIG. 3 only depicts eight projections but those in the art will understand that there are typically on the order of 180 or so such projections distributed at one degree increments.

Accordingly, after data has been acquired for only a few of these initial projections, it will be seen that all such data only comes from a relatively small included angle. Accordingly, a reasonable image cannot be expected until much later in the data acquisition procedure. Where the total data acquisition procedure may only take a few seconds (and possibly even less than a second), as in conventional X-ray computed tomography, the results may still be considered timely and it may still be possible to substantially avoid motion artifacts by patient breath-holding and the like. However, where NMR imaging is involved, the overall data acquisition cycle for a complete image is typically much longer (e.g. on the order of one minute or more).

Figure 3B:
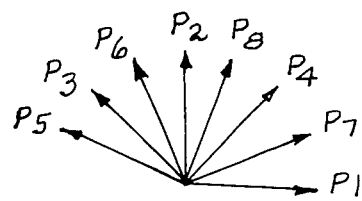

Accordingly, in accordance with a first exemplary embodiment of this invention as depicted in FIG. 3B, the data acquisition sequences are altered so as to "jump around" and initially obtain NMR projection views from widely separated angles thus achieving an initial capturing sequence which is richer with low spatial frequency content than would otherwise be the case. For example, as depicted in FIG 3B, after first projection P1 is taken, a second projection P2 may be taken at a relative angle of 90°. Thereafter, the thus defined 90° sectors are bisected so as to next take data defining projections P3 and P4. Thereafter, the thus defined 45° angular segments are further bisected so as to next take data defining projections P5, P6, P7 and P8. The process of subdividing the included angle between adjacent projections is continued until a desired minimum separation angle between projection views has been obtained.

Figure 4:
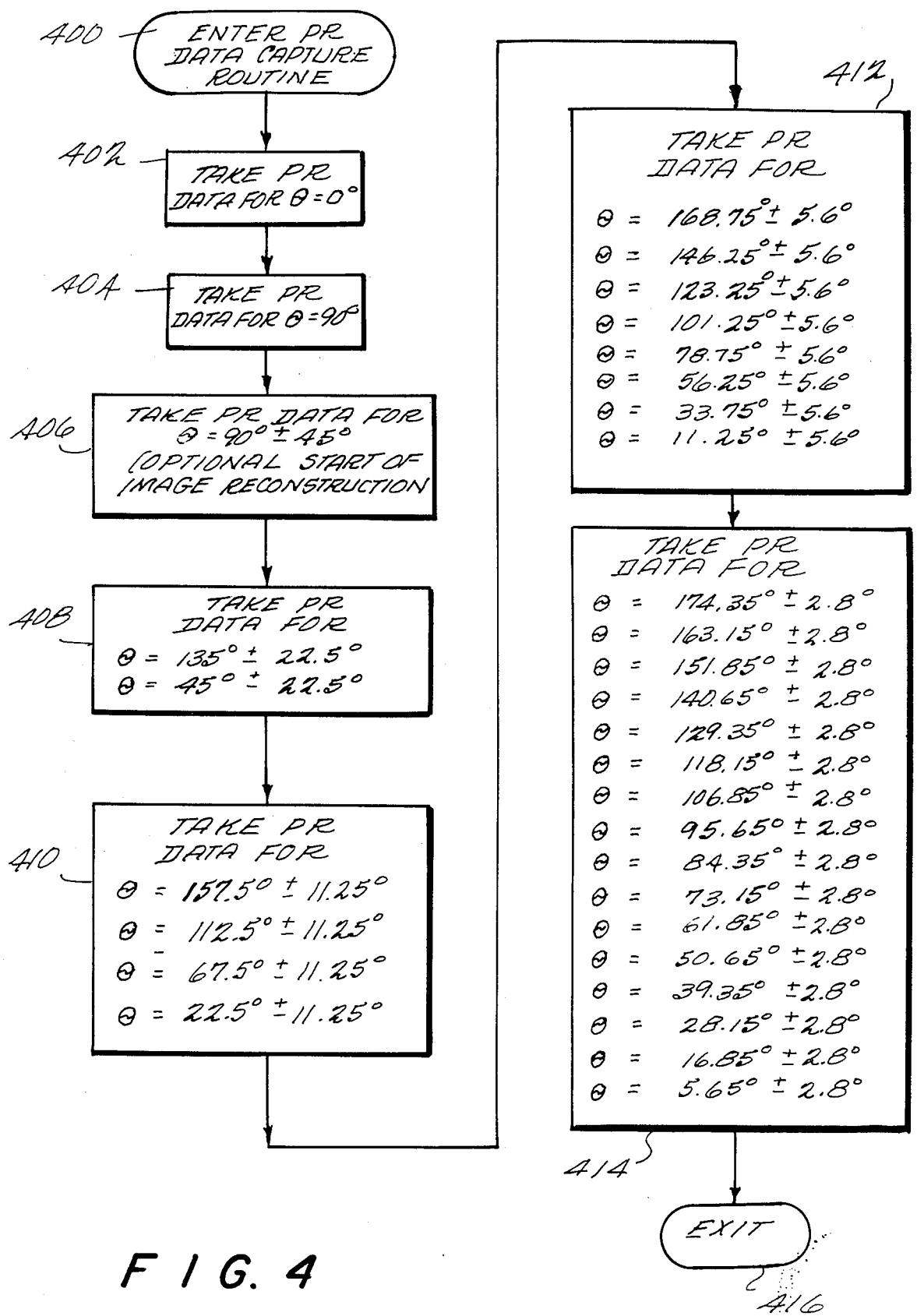
FIG. 4 is a flow chart of an exemplary computer program that may be used for a PR data capturing routine as depicted in FIG. 3B.

Since the data acquisition and display computer 30 and the control computer 32 have a modus operandi determined by suitable program instructions stored in associated memory devices, and since the X, Y, Z gradient coils 16 do not have to be moved, the entire system is, subject to proper program control, capable of implementing any desired arbitrary data acquisition sequence. Accordingly, the desired resequencing of FIG. 3B can be obtained by merely changing the stored program for a projection reconstruction data capturing routine. For example, one possible program is depicted in the flow chart of FIG. 4 where a PR data acquisition routine is entered at 400. To get the process started, data defining a projection at some initial view angle of 0° is effected at 402 and for 90° at 404. Image reconstruction could actually start at any time after two or more sets of projection view data are available. For example, as depicted in FIG. 4, such image reconstruction and display can optionally be started as the last portion of step 404—even before additional sets of projection data for relative angles of 90° plus and minus 45° are taken. Typically, the image reconstruction process itself would be controlled by a separate computer processor which continues the reconstruction process based upon raw projection view data fed to it from the output of the data capturing routine depicted in FIG. 4.

As should be appreciated, the order of taking projection views at 45° and 135° (e.g. 45 followed by 135 or 135 followed by 45) is not significant. Similarly, in this exemplary embodiment, each time the angles between previous projections are bisected, the exact order in which the bisecting projection views are taken is not significant.

At block 408 in FIG. 4, four more projection views are taken so as to bisect the 45° angles between previously taken projection views. Then, at block 410, the thus resulting 22.5° angles between previous projection views are further bisected by the taking of eight further projection views. At block 412, sixteen further projection views are taken so as to bisect the previously defined 11.25° angles between previously taken projection views. Similarly, at block 414, 32 additional projection views are taken so as to bisect the 5.6° angles between previously taken projection views. The same process can be repeated, if desired, to an even finer degree of detail (e.g. 64 more projections so as to produce a projection view every 1.4° or, a further additional 128 projection views so as to provide a projection each 0.7° increment). Finally, a conventional exit is taken at 416 from the data capturing routine of FIG. 4. It will be appreciated by those in the art that the flow chart of FIG. 4 is simplified so as not to obscure the salient non-conventional points of the exemplary embodiment. It may be utilized, for example, with a further subroutine control program capable of taking NMR data defining a projection view at any arbitrary input relative angular orientation—which subroutine is considered to be well within the ordinary skill of this art.

Figure 5:
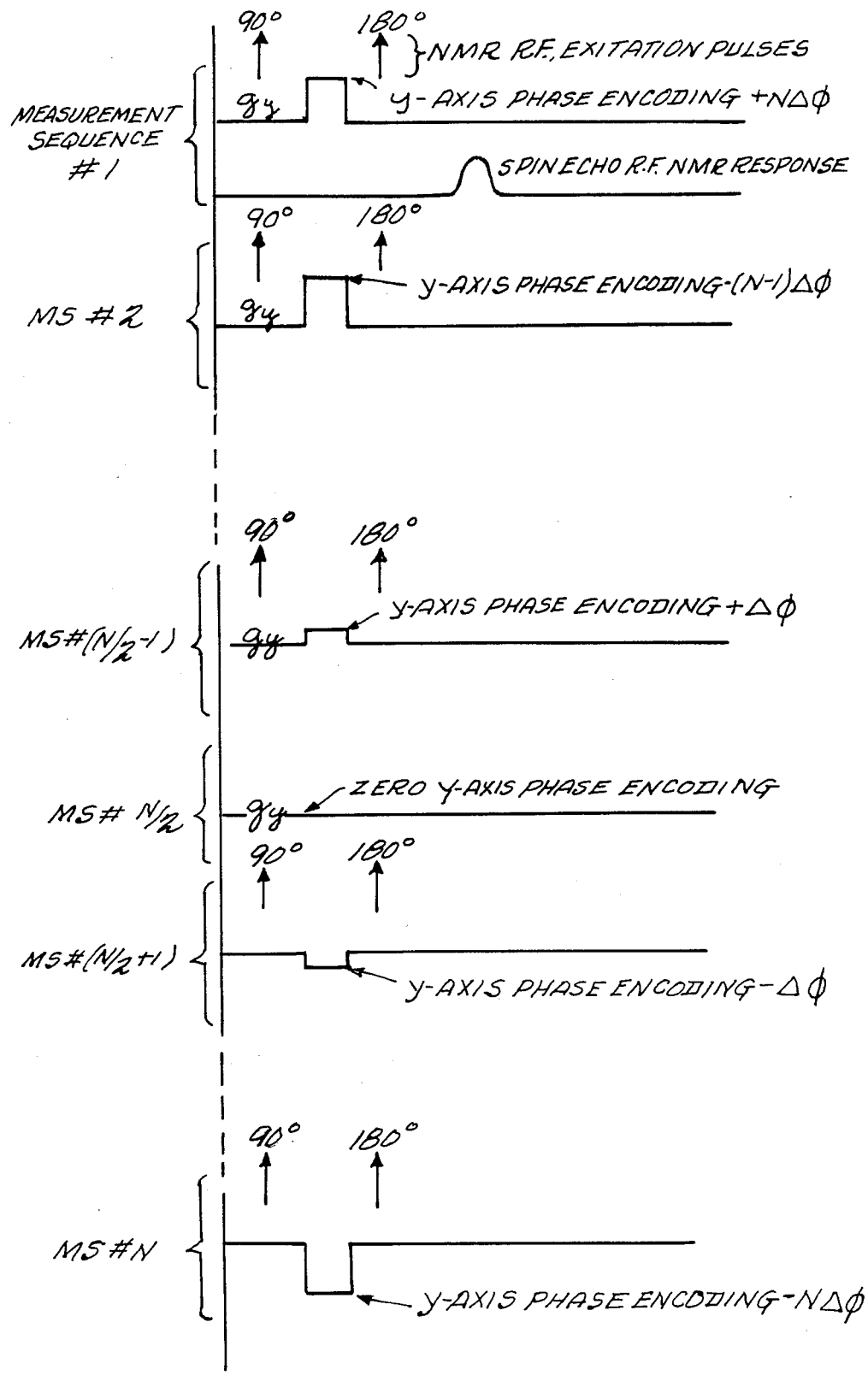
FIG. 5 is an abbreviated waveform diagram of a prior art NMR Fourier transform (FT) image reconstruction data acquisition cycle.

With respect to Fourier transform image reconstruction techniques, a typical prior art overall data acquisition cycle for an NMR FT image is depicted at FIG. 5. The above-referenced related patents and patent applications depict such data acquisition cycles in considerably more detail. However, the abbreviated depiction of FIG. 5 is sufficient to illustrate that a succession of measurement sequences (from top to bottom in FIG. 5) is utilized with a maximum degree of phase encoding used in the initial measurement sequence, followed by successively lesser degrees of phase encoding all the way down to a zero phase encoding sequence followed by successively increasing degrees of phase encoding in the opposite sense. The resulting spin echo rf NMR responses are typically captured (in digitized sampled form) and processed (e.g. by Fourier transformation) so as to provide pixel values for a resulting NMR image. Reference may be had to the above listed related U.S. patents and patent applications for a more detailed understanding of such, now conventional, NMR FT image reconstruction processes.

As will be apparent from a study of the well-known FT reconstruction equations, the move weakly phase-encoded data represents the lower spatial frequencies in the reconstructed image.

Figure 6:
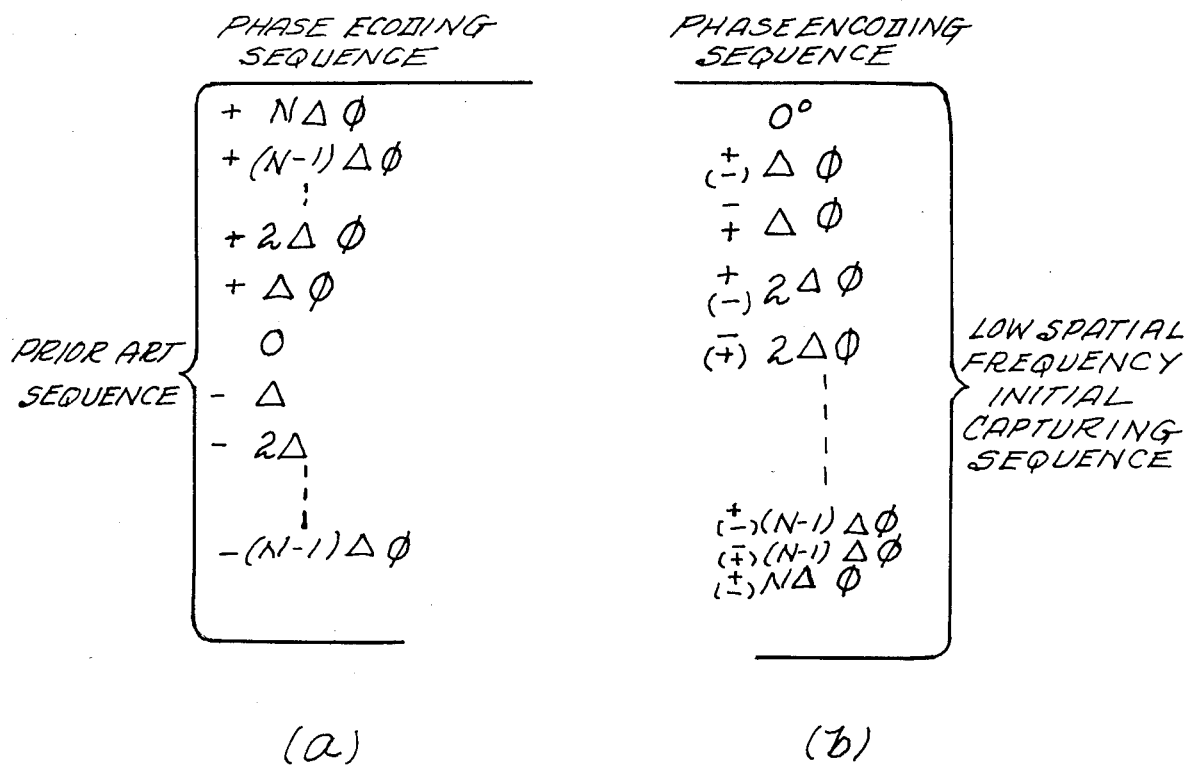
FIGS. 6A and 6B provide a comparative tabular depiction of a prior art FT data acquisition sequence (6A) and an exemplary data acquisition sequence in accordance with another embodiment of this invention (6B)

Such a prior art phase encoding sequence is depicted at FIG. 6A in tabular form and compared to FIG. 6B which shows a modified phase encoding sequence which starts at 0 and then progressively increases the magnitude of phase encoding (alternately in both senses) so as to capture the lower spatial frequency NMR image data during an earlier portion of the overall data acquisition cycle. It will be observed by reference to FIG. 5, that the new data acquisition cycle essentially starts in the middle of the old data acquisition cycle and then progresses outward therefrom in alternative fashion (i.e. both upward and downward in FIG. 5).

Figure 7:
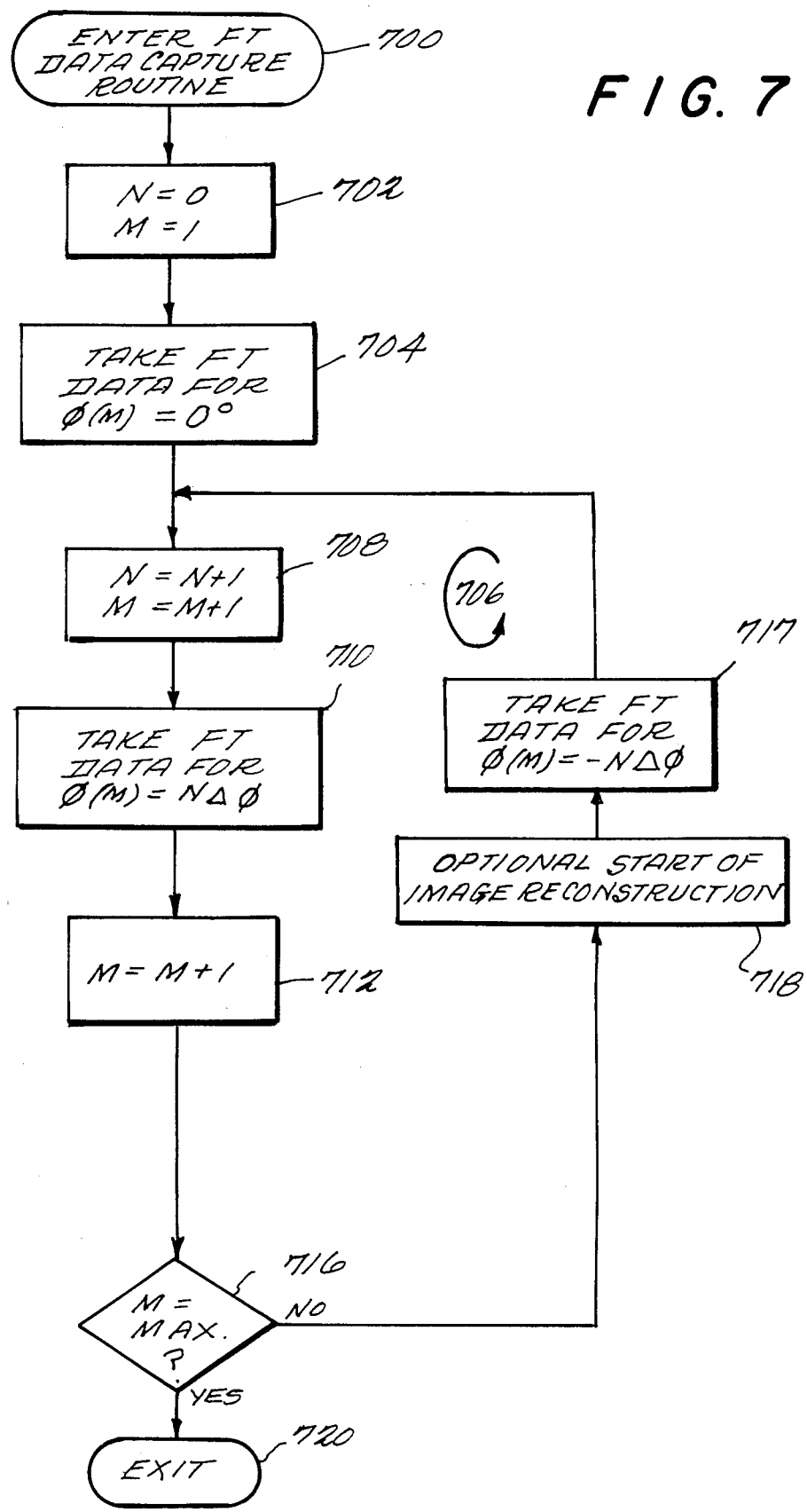
FIG. 7 is a flow chart of an exemplary embodiment of a computer program that may be utilized for an FT data capturing routine as depicted in FIG. 6B.

Once again, since the conventional apparatus of FIG. 1 is capable of achieving arbitrary data acquisition sequences if properly programmed, the desired new order of data acquisition can be achieved by altering the program which controls data acquisition. One exemplary embodiment for the altered FT data capturing routine can be entered at box 700 in FIG. 7. Thereafter, counters M and N are initialized at 702 before Fourier transformed data is taken at 704 for 0 phase encoding. Thereafter, a loop 706 is entered where counters N and M are incremented at 708 and Fourier transform image data is then taken for positive phase encoding of one increment at block 710. Thereafter, counter M is incremented at 712. A test for a maximum number of M data sets is made at 716 and, unless the maximum number of desired data sets has yet been reached, another set of Fourier transform image data is taken at 717 for a negative one increment of phase encoding. On subsequent passes through loop 706, positive N increments and negative N increments of phase encoding will be effected at blocks 710 and 717 respectively. Control is returned to the top of loop 706 at box 708. As also depicted at box 718, if desired, image reconstruction and display can actually be started after only a few Fourier transform data set views are at hand thus providing an early recognizable "live" image depiction for the operator. After all of the desired data sets have been taken, the loop 706 will be completed at box 716 and an exit from the routine of FIG. 7 will be taken normally at 720.

Figure 8:
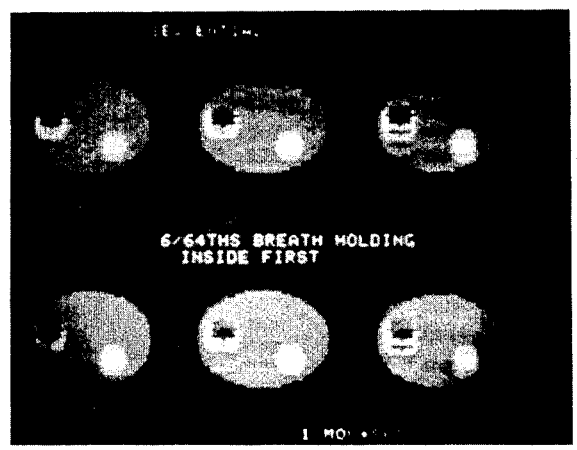
FIGS. 8-11 are photographs of simulated reconstructed NMR images illustrating an NMR FT imaging procedure having decreased motion artifact and more timely recognizable image reconstruction ability in accordance with an exemplary embodiment of this invention.
Figure 9:
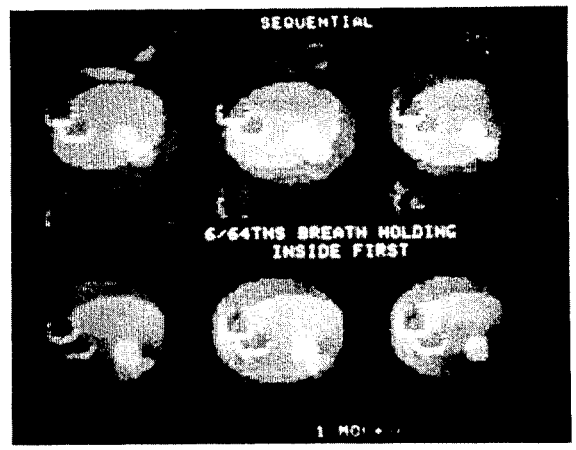

To illustrate the potential advantage of such reordered data acquisitions (e.g. so as to minimize motion artifact), a phantom object of 64×64 pixels has been computer generated with an identical second phantom object displaced along the X and/or Y axis. With such phantom data, both PR and FT data sets can be simulated and the displaced phantom object may be used to simulate motion apparently occurring at any desired point in time during the imaging procedure. A complete data set may thus be constructed so as to consist of projection data obtained both before and after the motion has occurred. In this manner, one may simulate the effect of changing the data acquisition order. FIGS. 8 and 9, for example, are photographs which compare reconstructed images obtained using conventional sequential sets of projections as compared to images obtained from simulated data reordered in accordance with this invention. As shown in the figures, comparisons are made, for simulated motions occurring at different times during a data gathering procedure. The reordered data acquisitions clearly produce decreased motion artifact effects in the visual images.

In FIG. 8, a simulated phantom has moved in the vertical direction during an NMR FT data gathering procedure after only approximately 10% of the procedure has been completed (in a 64 second procedure, the motion is thus at the sixth second point), and then continues to move regularly thereafterwards. The bottom row of images shown in FIG. 8 represents the images obtained from a reordered sequence where a zero phase encoding projection is first obtained. Each vertical column shows a somewhat different simulated movement sequence, but all show decreased artifacts in the bottom row of images.

FIG. 9 is essentially the same as FIG. 8 except that the object has been displaced in X and Y coordinates by a relatively larger amount (e.g. 5 pixels each). In both cases, the simulated motion does to some extent blur the object, but in the bottom row (representing images obtained using reordered data acquisition sequences in accordance with this invention) such motion artifacts are less evident.

Figure 10:
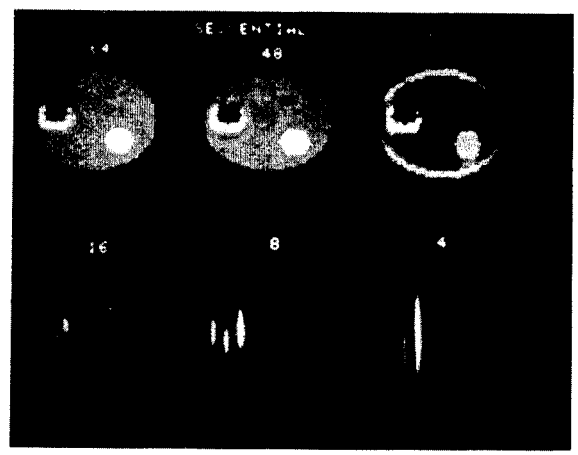
Figure 11:
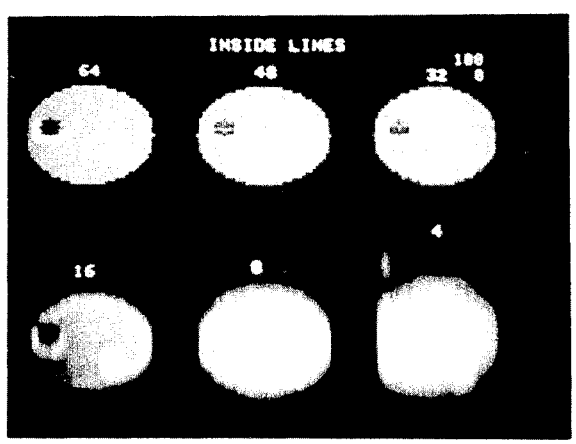

FIG. 10 depicts the NMR image that is obtained by reconstructing different numbers (e.g. 4 to 64) of sequential NMR/FT data sets (i.e. using a conventional FT data acquisition sequence). Note that approximately 32 projections are necessary before any reasonable likeness of the image is apparent. FIG. 11, on the other hand, similarly shows, a series of reconstructed NMR images of the phantom obtained using different numbers (e.g. 4 to 64) of FTNMR data sets but with data sets that have been obtained in a reordered data acquisition sequence in accordance with this invention. It should be noted that the basic outline of the phantom is recognizable after only four data sets have been acquired and that as few as sixteen data sets produce a somewhat blurry but nevertheless recognizable likeness of an object therewithin. Thus, as should be apparent from comparing FIGS. 10 and 11, the reordered data acquisition sequence of this invention will permit more timely reconstructed recognizable NMR images to be made available to the operator of such an apparatus thus permitting much more effective monitoring and control of the NMR data acquisition procedure.

Figure 12:
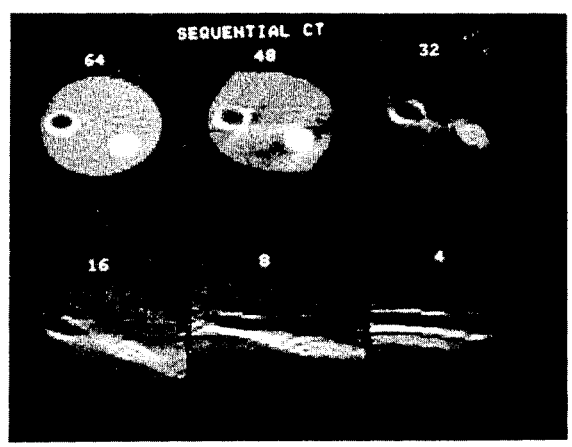
FIGS. 12 and 13 are photographs illustrating similar results for NMR PR imaging procedures and are generally analogous to FIGS. 10 and 11 respectively.
Figure 13:
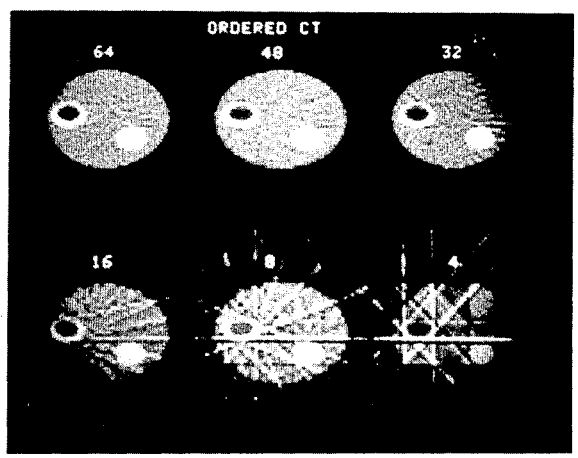

FIGS. 12 and 13 are similar to FIGS. 10 and 11 respectively but illustrate the use of projection reconstruction NMR imaging procedures. As will be observed, the same improved timeliness is apparent using a reordered data gathering sequence as in FIG. 13 as compared to the more conventional sequential data acquisition procedures used in FIG. 12.

While only a few exemplary embodiments of this invention have been described in detail, those skilled in the art will recognize that there are many possible variations and modifications which may be made in the exemplary embodiments while yet retaining many of the novel and advantageous features of this invention. Accordingly, it is intended that the following claims cover all such modifications and variations.

What is claimed is:
1. An NMR imaging apparatus comprising:
NMR excitation means for eliciting plural successive NMR responses from an object to be imaged during a complete NMR image data acquisition cycle;
NMR detection means for detecting and processing said NMR responses into digital signals representing an image of at least a portion of said object;

said NMR excitation means including sequence control means for eliciting responses in a predetermined order which provides lowe spatial frequency image data during an initial part of a data acquisition cycle and higher spatial frequency image data thereafter during the remaining part of said data acquisition cycle;

said means for detecting and processing using a succession of phase-encoded NMR responses in a Fourier-transform reconstruction technique;

said excitation means eliciting successive NMR responses using relative phase-encoding which alternates in polarity and progressively increases in magnitude; and said means for detecting and processing including image reconstruction means for accepting the NMR responses which occur during said initial part of the data acquisition cycle and for reconstructing an initial NMR image based thereon.

2. An NMR imaging method comprising:

eliciting plural successive NMR responses from an object to be image during a complete NMR image data acquisition cycle;

detecting and processing said NMR responses into digital signals representing an image of at least a portion of said object;

said eliciting step including eliciting responses in a predetermined order which provides lower spatial frequency image data during an initial part of a data acquisition cycle and higher spatial frequency image data thereafter during the remaining part of said data acquisition cycle;

said detecting and processing step using a succession of phase-encoded NMR responses in a Fourier-transform reconstruction technique;

said eliciting step eliciting successive NMR responses using relative phase-encoding which alternates in polarity and progressively increases in magnitude; and said detecting and processing step including reconstruction an initial NMR image based on an initially occurring plurality of less than all of said NMR responses.

* * * * *